(12) United States Patent
Kim et al.

(10) Patent No.: US 9,798,426 B2
(45) Date of Patent: Oct. 24, 2017

(54) TOUCH PANEL AND METHOD OF MANUFACTURING THEREOF

(71) Applicant: Samsung Display Co., Ltd., Yongin (KR)

(72) Inventors: Jin Hwan Kim, Seoul (KR); Hee Woong Park, Hwaseong-si (KR); Joo-Han Bae, Seongnam-si (KR); Byeong Kyu Jeon, Busan (KR)

(73) Assignee: Samsung Display Co., Ltd., Yongin-si (KR)

( * ) Notice: Subject to any disclaimer, the term of this patent is extended or adjusted under 35 U.S.C. 154(b) by 365 days.

(21) Appl. No.: 14/458,840

(22) Filed: Aug. 13, 2014

(65) Prior Publication Data

US 2015/0122624 A1    May 7, 2015

(30) Foreign Application Priority Data

Nov. 6, 2013    (KR) .......................... 10-2013-0134395

(51) Int. Cl.
*H01H 13/70* (2006.01)
*H01H 25/00* (2006.01)
(Continued)

(52) U.S. Cl.
CPC ............ *G06F 3/044* (2013.01); *G06F 1/1652* (2013.01); *G06F 2203/04102* (2013.01); *G06F 2203/04111* (2013.01); *H03K 2217/96015* (2013.01)

(58) Field of Classification Search
CPC ........ H01H 13/70; H01H 25/00; H01H 25/04; H01H 1/00; H01H 13/702–13/704; H01H 2239/074; H01H 2203/008; H01H 2207/01; H01H 2221/00; H01H 2231/002; H01H 2231/012; H01H 2231/016; H01H 2231/052; H01H 2239/006; G06F 3/041;
(Continued)

(56) References Cited

U.S. PATENT DOCUMENTS

| 6,677,709 B1* | 1/2004 | Ma ........................ G09G 3/3216 200/512 |
| 2011/0227840 A1* | 9/2011 | Sim ......................... G06F 3/044 345/173 |

(Continued)

FOREIGN PATENT DOCUMENTS

| JP | 3183265 | 4/2013 |
| KR | 101059382 | 8/2011 |

(Continued)

*Primary Examiner* — Anthony R. Jimenez
(74) *Attorney, Agent, or Firm* — H.C. Park & Associates, PLC

(57) ABSTRACT

A touch panel including: a substrate; first conductive patterns separately disposed on the substrate with a preset distance therebetween; second conductive patterns formed thereon to separately intersect the first conductive patterns with a preset distance therebetween; a second connecting member configured to connect adjacent second conductive patterns to each other; an insulating pattern configured to cover a preselected region of the second connecting member; and a first connecting member disposed on the insulating pattern to connect adjacent first conductive patterns to each other. The first conductive patterns and the second conductive pattern portion are flexible.

4 Claims, 19 Drawing Sheets

(51) Int. Cl.
*H01H 25/04* (2006.01)
*G06F 3/044* (2006.01)
*G06F 1/16* (2006.01)

(58) Field of Classification Search
CPC ........ H03K 17/975; B05D 5/12; C23C 14/34; H01L 21/28
USPC ........... 345/173, 174; 200/5 R, 600, 46, 5 A, 200/292, 243
See application file for complete search history.

(56) References Cited

U.S. PATENT DOCUMENTS

| | | | |
|---|---|---|---|
| 2011/0279403 | A1 | 11/2011 | Lee et al. |
| 2011/0308929 | A1* | 12/2011 | Kim ........................ G06F 3/044 200/600 |
| 2013/0069887 | A1* | 3/2013 | Lee ........................ G06F 3/044 345/173 |
| 2013/0181944 | A1 | 7/2013 | Lee et al. |
| 2014/0209444 | A1 | 7/2014 | Lai et al. |

FOREIGN PATENT DOCUMENTS

| | | |
|---|---|---|
| KR | 1020120008153 | 1/2012 |
| KR | 101248813 | 4/2013 |
| KR | 101251413 | 4/2013 |
| KR | 101260726 | 5/2013 |
| KR | 1020130052369 | 5/2013 |

\* cited by examiner

TOUCH PANEL AND METHOD OF
MANUFACTURING THEREOF

CROSS-REFERENCE TO RELATED
APPLICATION

This application claims priority from and the benefit of Korean Patent Application No. 10-2013-0134395, filed on Nov. 6, 2013, which is hereby incorporated by reference for all purposes as if fully set forth herein.

BACKGROUND

Field

Exemplary embodiments of the present invention relate to a touch panel and a method of manufacturing the touch panel.

Discussion of the Background

A flat panel display (FPD), such as a liquid crystal display (LCD), an organic light emitting diode (OLED) display, and an electrophoretic display (EFD) includes a field generating electrode and an electro-optical active layer. The liquid crystal display may include a liquid crystal layer as the electro-optical active layer, the organic light emitting diode display may include an organic emission layer as the electro-optical active layer, and the electrophoretic display may include charged particles. The field generating electrode is connected to a switching element, such as a thin film transistor, to receive a data signal, and the electro-optical active layer converts the data signal to an optical signal to display an image.

Recently, such a display device has included a touch sensing function in which interaction with a user may be performed, in addition to a function of displaying the image. The touch sensing function is directed to detecting touch information, such as whether an object approaches or touches a screen, and a touch location thereof, by sensing changes in pressure, charges, light, and the like, which are applied to the screen by the display device, when the user writes text or draws figures by approaching or touching the screen using a finger or a touch pen. The display device may receive an image signal based on the touch information to display an image.

The above information disclosed in this Background section is only for enhancement of understanding of the background of the invention and, therefore, it may contain information that does not constitute prior art.

SUMMARY

Exemplary embodiments of the present invention provide a touch panel and a method of manufacturing the touch panel, in which the touch panel may be usable in a flexible display device.

Additional features of the invention will be set forth in the description which follows, and in part will be apparent from the description, or may be learned by practice of the invention.

An exemplary embodiment of the present invention discloses a touch panel including: a substrate; rows of first conductive patterns disposed on the substrate in a first direction and spaced apart by a preset distance, each first conductive pattern being separately formed; columns of second conductive patterns disposed on the substrate in a second direction so as to separately intersect the rows of first conductive patterns, the columns being spaced apart by a preset distance; a second connecting member connecting adjacent second conductive patterns; an insulating pattern covering a preselected region of the second connecting member; and a first connecting member disposed on the insulating pattern connecting adjacent first conductive patterns, wherein the first conductive patterns and the second conductive patterns are flexible.

An exemplary embodiment of the present invention also discloses a method of manufacturing a touch panel, including: disposing a flexible conductor on a substrate; forming rows of first conductive patterns in a first direction, columns of second conductive patterns in a second direction intersecting the first direction, and a second connecting member connecting the second conductive patterns by patterning the flexible conductor; forming an insulating pattern to cover a preselected region of the second connecting member; and forming a first connecting member on the insulating pattern connecting adjacent first conductive patterns to each other.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

FIG. 4 to FIG. 30 are partial cross-sectional views and top plan views showing a manufacturing process of a touch panel in accordance with an exemplary embodiment of the present invention, in which FIGS. 4, 6, 9, 12, 14, 16, 19, 21, 23, 26, and 28 are partial cross-sectional views taken along a line II-II' of FIG. 1; FIGS. 3, 5, 7, 10, 13, 15, 17, 20, 22, 24, 27, and 29 are partial cross-sectional views taken along a line III-III' of FIG. 1; and FIGS. 8, 11, 18, 25, and 30 are top plan views.

Figure 1:
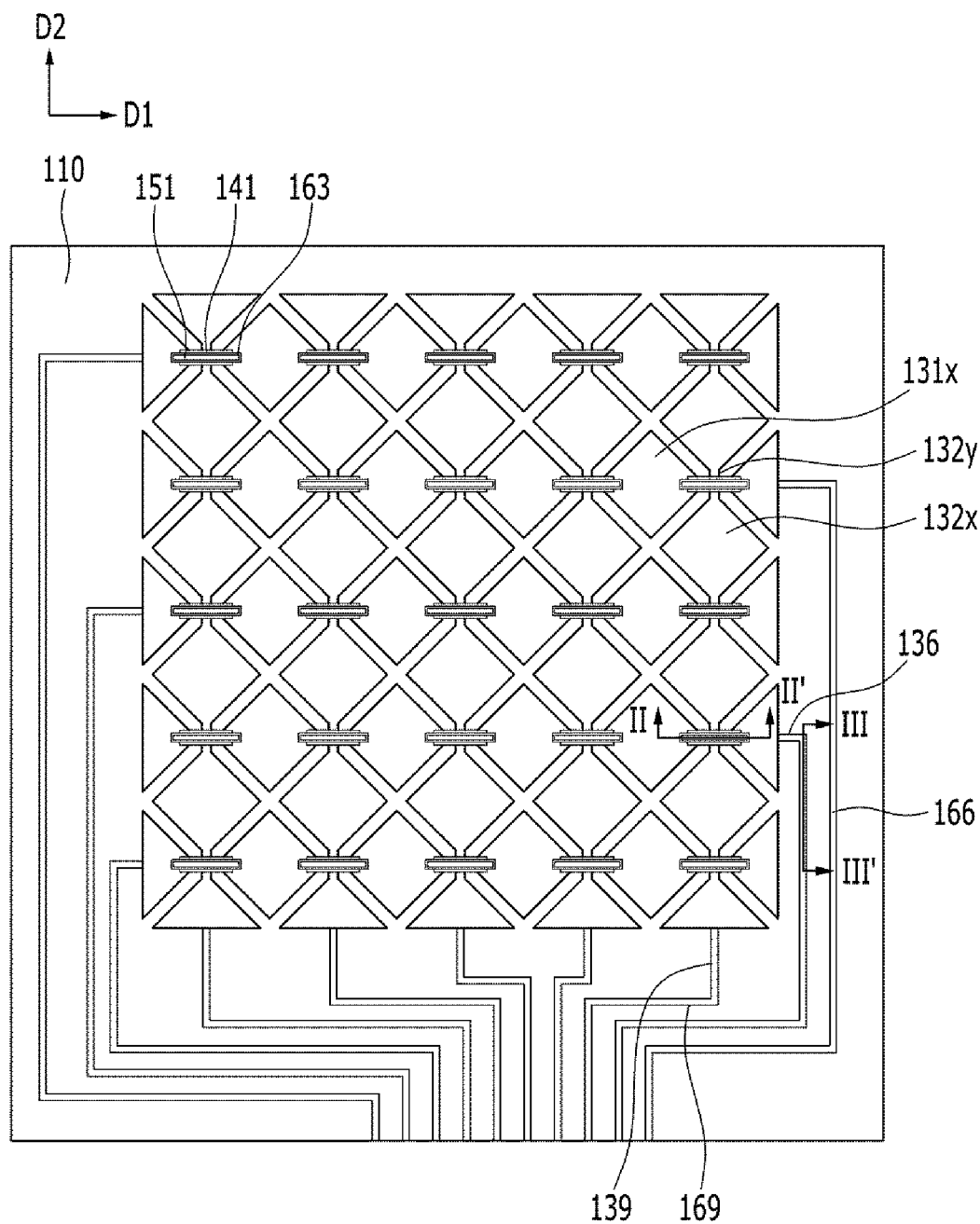
FIG. 1 is a top plan view showing a touch panel in accordance with an exemplary embodiment of the present invention.

DETAILED DESCRIPTION OF THE
ILLUSTRATED EMBODIMENTS

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these embodiments are provided so that this disclosure is thorough, and will fully convey the scope of the invention to those skilled in the art.

In the drawings, the size and relative sizes of layers and regions, including the thickness of layers, films, panels, regions, etc., may be exaggerated for clarity. Like reference numerals in the drawings denote like elements. It will be understood that when a first part of a layer, a film, a plate, or the like is described as being arranged "on" or "over" a second part, the first part is arranged on or over the second part, either directly or with a third part therebetween without the limitation to the upper side thereof on the basis of the gravity direction. It will also be understood that when an element or layer is referred to as being "on", "connected to", or "coupled to" another element or layer, it can be directly on, directly connected to, or directly coupled to the other element or layer, or intervening elements or layers may be present. In contrast, when an element is referred to as being "directly on," "directly connected to", or "directly coupled to" another element or layer, there are no intervening elements or layers present. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

Although the terms first, second, third, etc. may be used herein to describe various constituent elements, they are not limited thereto. The terms are used only for the purpose of discriminating one constituent element from another constituent element.

Hereinafter, a touch panel in accordance with an exemplary embodiment of the present invention will be described with reference to FIG. 1 to FIG. 3B.

Figure 2A:
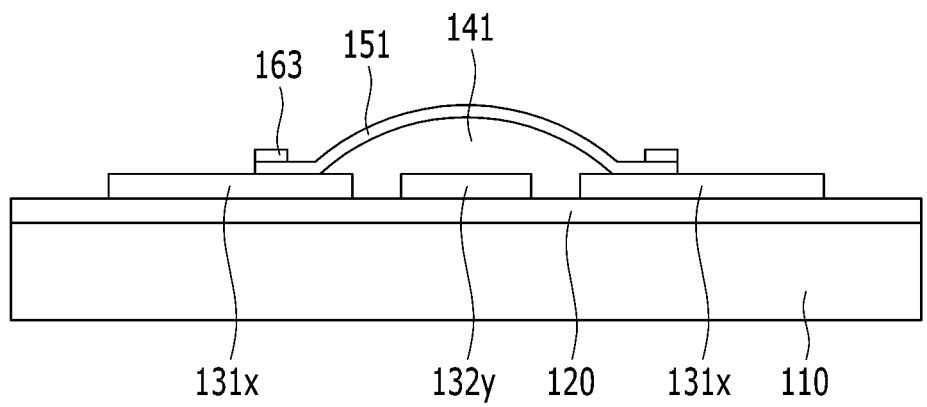
FIG. 2A and FIG. 2B are cross-sectional views taken along a line II-IF of FIG. 1.
Figure 2B:
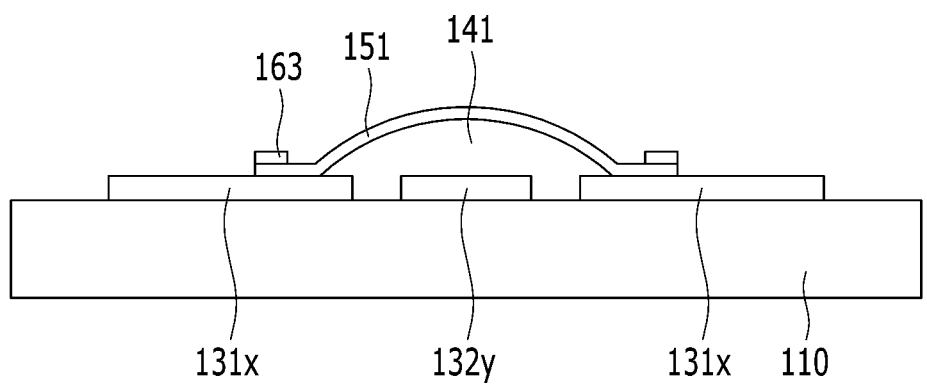
Figure 3A:
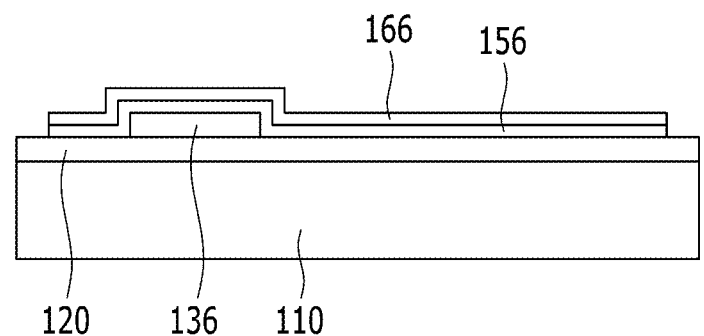
FIG. 3A and FIG. 3B are cross-sectional views taken along a line III-III' of FIG. 1.
Figure 3B:
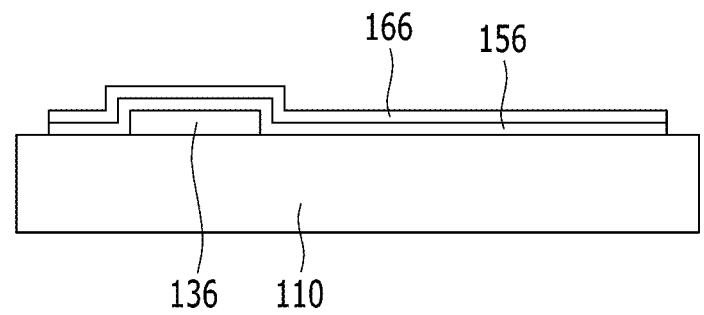

FIG. 1 is a top plan view showing the touch panel in accordance with an exemplary embodiment of the present invention. FIG. 2A and FIG. 2B are cross-sectional views taken along a line II-IF of FIG. 1. FIG. 3A and FIG. 3B are cross-sectional views taken along a line III-III' of FIG. 1.

Referring to FIG. 1, the touch panel includes a substrate 110, conductive patterns 131$x$, 132$x$, and 132$y$, an insulating pattern 141, a first connecting member 151, and the like. As shown in FIG. 1, the first conductive patterns 131$x$ of the touch panel are electrically connected to each other by the first connecting members 151, and are separated and insulated from the second conductive patterns 132$x$ by the insulating pattern 141.

Hereinafter, members of the touch panel will be described with reference to FIG. 2A, FIG. 2B, FIG. 3A, and FIG. 3B.

The substrate 110 is provided at a bottom portion of a stacked structure of the touch panel. As shown therein, the substrate 110 has a planar shape, but it is not limited thereto. Alternatively, the substrate 110 may have a curved shape.

The substrate 110 may be made of various materials, and may be formed by using a stacked structure made of glass, plastic, an organic material, or an inorganic material. For example, the substrate 110 may be formed of a polymer resin layer. Further, when the substrate 110 is made of glass, a polymer resin layer 120 is provided on the substrate 110, as shown, for example, in FIG. 2A and FIG. 3A. However, one of the substrate 110 and the polymer resin layer 120 need not be provided. For example, FIG. 2B and FIG. 3B show a structure in which the polymer resin layer 120 is not provided.

The first conductive patterns 131$x$, the second conductive patterns 132$x$, and a second connecting member 132$y$ are disposed on the substrate 110.

The first conductive patterns 131$x$, the second conductive patterns 132$x$, and the second connecting member 132$y$ may be made of a flexible material, which may be Ag nanowire (AgNW) in an exemplary embodiment.

The first conductive patterns 131$x$, the second conductive patterns 132$x$, and the second connecting member 132$y$ may be formed by a photolithography process.

The first conductive patterns 131$x$ may be arranged in parallel rows extending in a first direction D1. The second conductive patterns 132$x$ be arranged in parallel rows in a second direction D2 that is substantially perpendicular to the first direction D1. The first conductive patterns 131$x$ and the second conductive patterns 132$x$ are alternately disposed separately from each other.

The first conductive patterns 131$x$ may be formed in series along the first direction, each having a rhombic shape. The first conductive patterns 131$x$ are not directly connected to each other, as shown, for example, in FIG. 8. Adjacent ones of the first conductive patterns 131$x$ are electrically connected to each other by the first connecting member 151, which will be described later.

Figure 8:
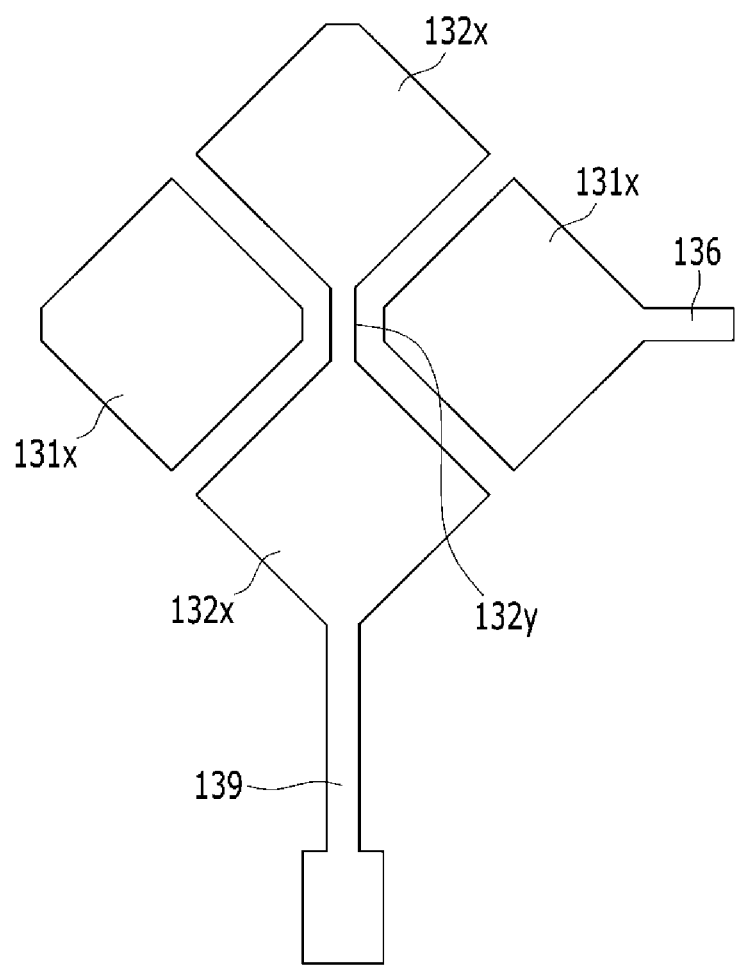

First extension members 136 are connected to the first conductive patterns 131$x$. The first extension members 136 are connected to edges of the first conductive patterns 131$x$, as shown in FIG. 8. The first extension members 136 may be formed to first extend in the first direction D1, and then the second direction D2, to an end of the substrate 110, e.g., an upper side or a lower side of the substrate 110.

The first extension members 136 extended to the end of the substrate 110 are electrically connected to a circuit unit (not shown) for controlling and driving the touch panel.

The second conductive patterns 132$x$ may also have a shape that is similar to the planar shape of the first conductive patterns 131$x$. For example, each of the second conductive patterns 132$x$ also may have a rhombic shape.

The second conductive patterns 132$x$ may be formed in series in the second direction D2, e.g., a vertical direction. A second connecting member 132$y$ is disposed between the adjacent second conductive patterns 132$x$ to make a connection therebetween, as shown in FIG. 1.

Second extension members 139 may be formed at outermost portions of the second conductive patterns 132$x$, which extend in the second direction D2 to an end of the substrate 110, e.g., the upper side or the lower side of the substrate 110, as shown in FIG. 1. The second extension members 139 extended to the end of the substrate 110 are electrically connected to a circuit unit (not shown) for controlling and driving the touch panel.

The second extension members 139 may be formed of the same material as that of the first extension members 136.

The first conductive patterns 131$x$ are formed on the substrate 110 in rows which are in parallel with each other edge to edge in the first direction D1, and the second conductive patterns 132$x$ are formed between the first conductive patterns 131$x$ in rows which are in parallel with each other edge to edge in the second direction D2, which is substantially perpendicular to the first direction D1. In this case, the second conductive patterns 132$x$ are connected to each other by the second connecting members 132$y$.

The insulating pattern 141 is formed at a preselected region of the second connecting member 132$y$ to cover the second connecting member 132$y$, as shown in FIGS. 2A and 2B. The insulating pattern 141 insulates the first connecting member 151 from the second connecting member 132$y$.

The insulating pattern 141 is formed to contact the adjacent first conductive patterns 131$x$, and is formed in such a way so as to cover one region of opposite edges of the adjacent first conductive patterns 131$x$.

The insulating pattern 141 may be formed by various methods using various materials, e.g., an inorganic material. For example, the insulating pattern 141 may be formed by using a photolithography method. Alternatively, the insulating pattern 141 may be formed by using a solution-based process, in particular, an inkjet method or a spray method, without the need for an additional mask, thereby improving manufacturing efficiency.

The first connecting member 151 is formed on the insulating pattern 141 so as to contact the adjacent first conductive patterns 131$x$ to electrically connect the first conductive patterns 131$x$. In other words, the first connecting member 151 is formed to contact portions corresponding to opposite edges of adjacent ones of the first conductive patterns 131x.

As described above, the first connecting member 151 electrically connects the adjacent first conductive patterns 131x. Particularly, the first connecting member 151 serves to prevent the second conductive patterns 132x and the second connecting members 132y which are located perpendicular to each other from being brought into contact with the first conductive patterns 131x and to prevent the generation of a short-circuit.

The first connecting member 151 is located on the insulating pattern 141, and a width of the first connecting member 151 may be less than or equal to that of the insulating pattern 141. Accordingly, contact between the first connecting member 151 and the second conductive pattern portion 132x or the second connecting member 132y may be prevented.

The first connecting member 151 may be formed of a conductive material, in particular, a transparent conductive oxide (TCO). Examples of the TCO may include ITO, IZO, ZnO, AZO, and the like, but are not limited thereto.

An auxiliary connecting member 163 is provided above the first connecting member 151 to surround the border of the first connecting member 151, as shown in FIG. 1. The auxiliary connecting member 163 may be provided at the border of the first connecting member 151 to improve a process yield and prevent undercutting.

A material of the auxiliary connecting member 163 may have low resistance. For example, Cu, Al, Mo, or the like may be employed, but it is not limited thereto.

Although not shown, a passivation layer may be disposed to cover the first connecting member 151 and the auxiliary connecting member 163, as shown in FIG. 1. The passivation layer may be disposed to cover the first conductive patterns 131x and the second conductive patterns 132x as well as the first connecting member 151.

The touch panel of an exemplary embodiment may be a capacitive touch panel. In the case of the capacitive touch panel, once a user touches the touch panel, a capacitive change is made at the touched region, and the user's touch is recognized by sensing this touched region.

In the touch panel of an exemplary embodiment, rows of the first conductive patterns 131x are disposed in a first direction D1, rows of the second conductive patterns 132x are disposed in a second direction D2 intersecting the first direction, and adjacent second conductive patterns 132x are connected to each other through the second connecting member 132y. The insulating pattern 141 located at a preselected region of the second connecting member 132y is covered with the first connecting member 151 located on the insulating pattern 141 to electrically connect adjacent first conductive patterns 131x to each other.

Accordingly, the first conductive patterns 131x and the second conductive patterns 132x formed on the substrate 10 are insulated from each other, and electrical connection between the first conductive patterns 131x is facilitated. In particular, it is possible to embody a flexible touch panel because fine patterns of the first conductive patterns 131x, the second conductive patterns 132x, and the second connecting member 132y, which are formed of a material such as AgNW, can be easily formed. As a result, a flexible display device having excellent performance can be provided by improving durability and electrical characteristics of the flexible touch panel.

A method of manufacturing a touch panel will be described with reference to FIG. 4 to FIG. 30, which are partial cross-sectional views and top plan views showing a manufacturing process of a touch panel, in accordance with exemplary embodiments of the present invention.

Figure 4:
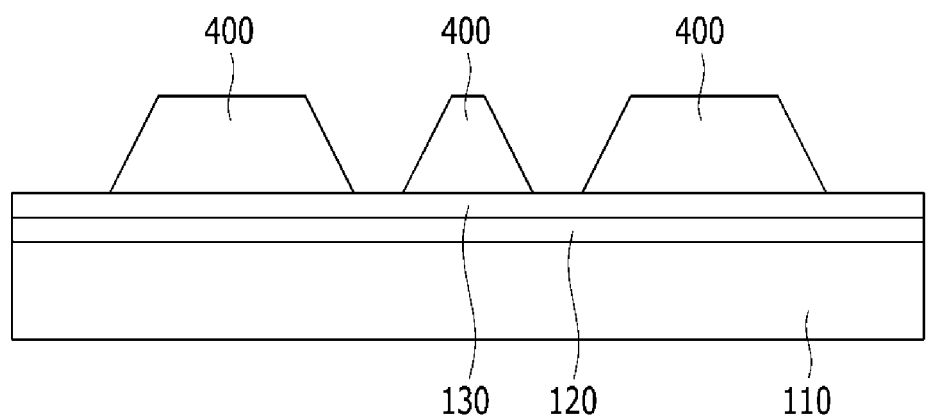
Figure 5:
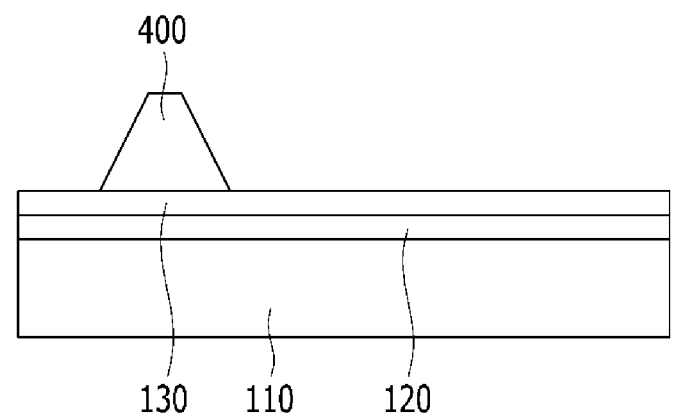
Figure 6:
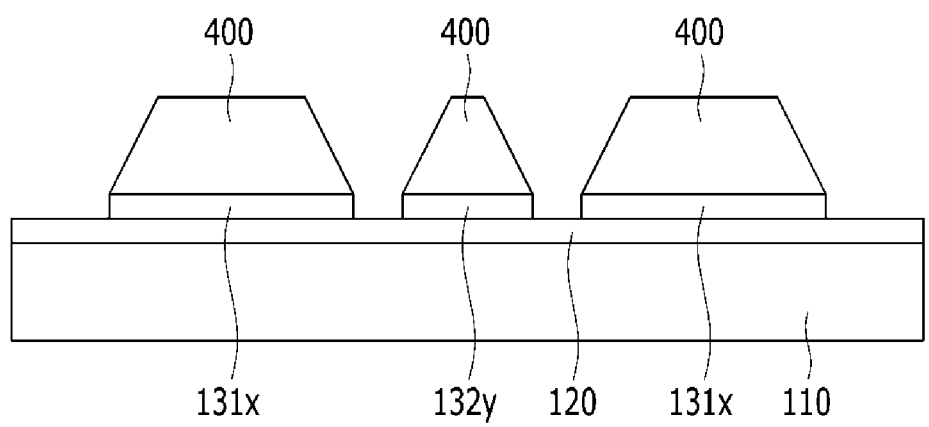
Figure 7:
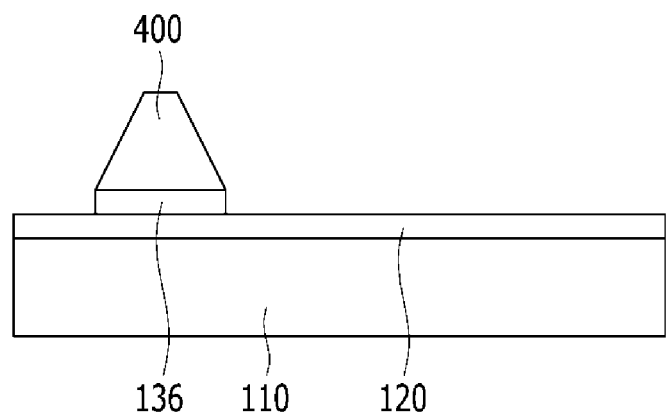

Referring to FIG. 4 and FIG. 5, a flexible conductor 130 is stacked on a substrate 110 and a polymer resin layer 120. In the present exemplary embodiment, the substrate 110 and the polymer resin layer 120 are separately shown, although one of them need not be provided. The flexible conductor 130 may be formed of AgNW, but it is not limited thereto. Alternatively, any transparent flexible conductor may be employed.

Next, as shown in FIG. 4 and FIG. 5, a first photosensitive film pattern 400 is formed on the flexible conductor 130 by using a mask. After the first photosensitive film pattern 400 is formed, a photolithography process is performed by using the photosensitive film pattern 400 in the manner shown in FIG. 6 and FIG. 7.

As shown in FIG. 8, first conductive patterns 131x, second conductive patterns 132x, a second connecting member 132y, extension members 136 and 139, and the like, are formed by etching the flexible conductor using the photolithography process.

The first photosensitive film pattern 400 used in the steps described with reference to FIG. 4 to FIG. 7 is then removed, and an insulating material is coated on the conductive patterns 131x, 132x, and 132y formed as described above.

An insulating pattern 141 may be formed on the entirely coated insulating material by using a photolithography method employing a mask, but it is not limited thereto. Alternatively, the insulating pattern 141 may be formed by using a solution-based process, specifically an inkjet method or a spray method, without providing an additional mask, thereby improving efficiency on the manufacturing process.

Figure 9:
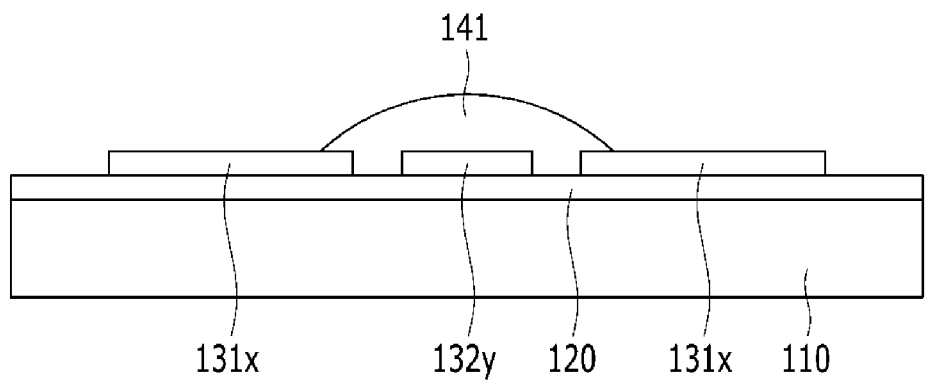
Figure 10:
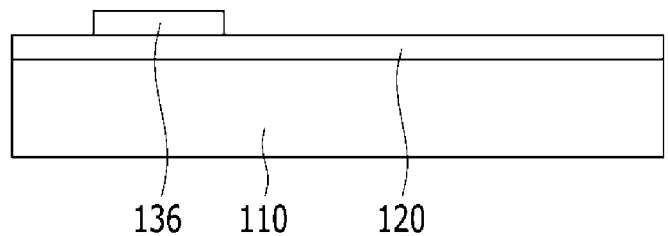

As shown in FIG. 9 and FIG. 10, the insulating pattern 141 is formed at a preselected region of the second connecting member 132y to cover the second connecting member 132y. The insulating pattern 141 serves to insulate the first connecting member 151 for connecting the second connecting member 132y with the first conductive pattern portion 131x.

Figure 11:
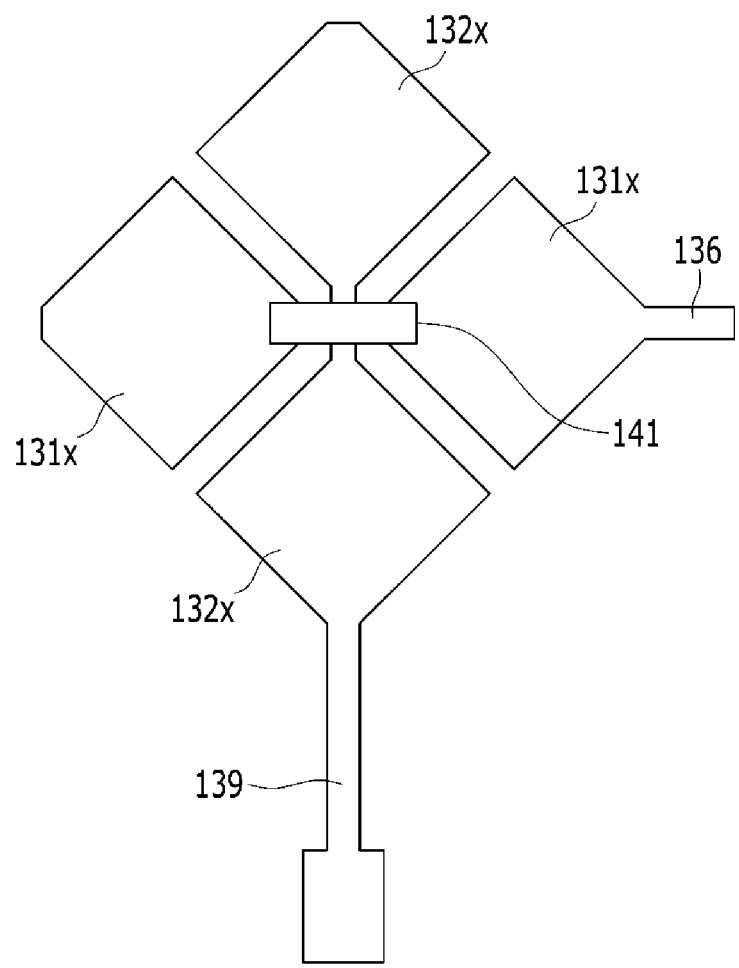

Referring to FIG. 11, the insulating pattern 141 is formed to come into contact with the adjacent first conductive patterns 131x, and is formed to cover one region of each opposite edge of the adjacent first conductive patterns 131x.

Although not additionally shown, a plasma treatment is performed on surfaces of the conductive patterns 131x, 132x, and 132y after the insulating pattern 141 is formed. The plasma surface treatment makes it possible to improve electrical contact conditions between the conductive patterns 131x and 132x and the first connecting member 151, as well as the adhesive force of the insulating film.

Figure 12:
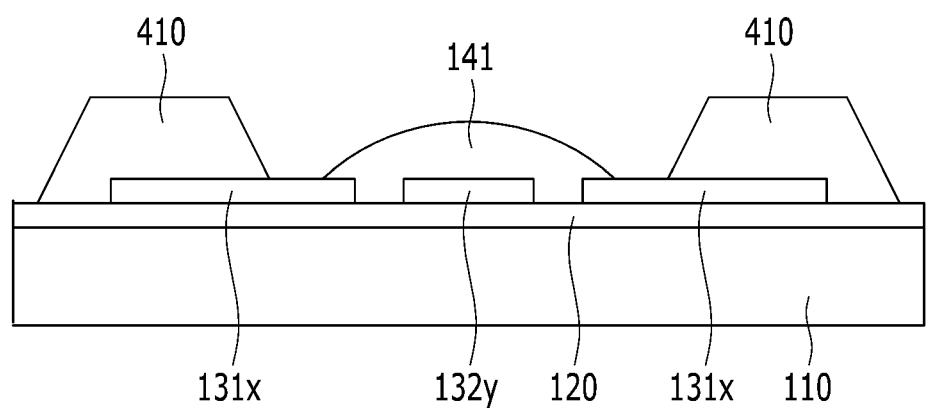
Figure 13:
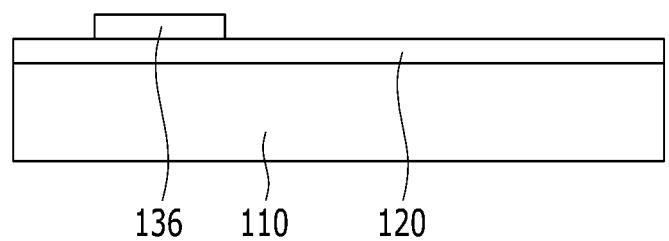
Figure 14:
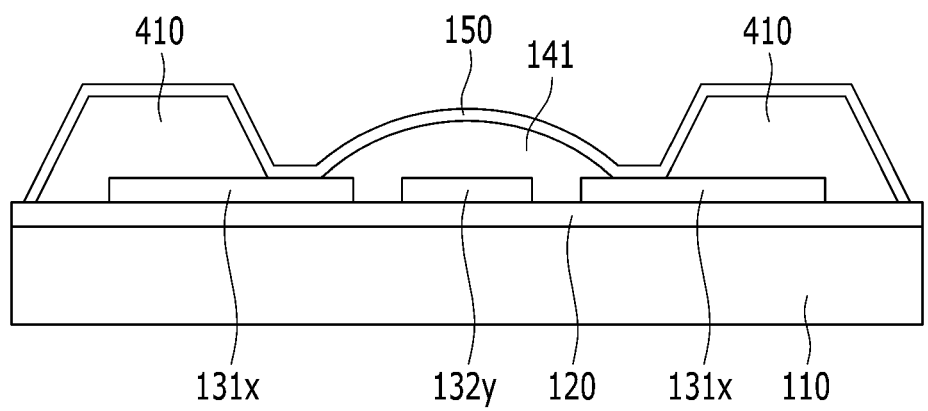
Figure 15:
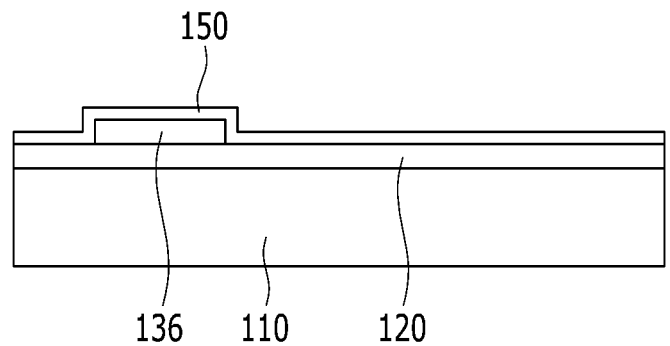

Next, a second photosensitive film pattern 410 is formed by using a mask as shown in FIG. 12 and FIG. 13. After the second photosensitive film pattern 410 is formed, a transparent conductive oxide (TCO) layer 150 is disposed thereon, as shown in FIG. 14 and FIG. 15. Examples of the TCO may include ITO, IZO, ZnO, AZO, and the like, but the present invention is not limited thereto.

Figure 16:
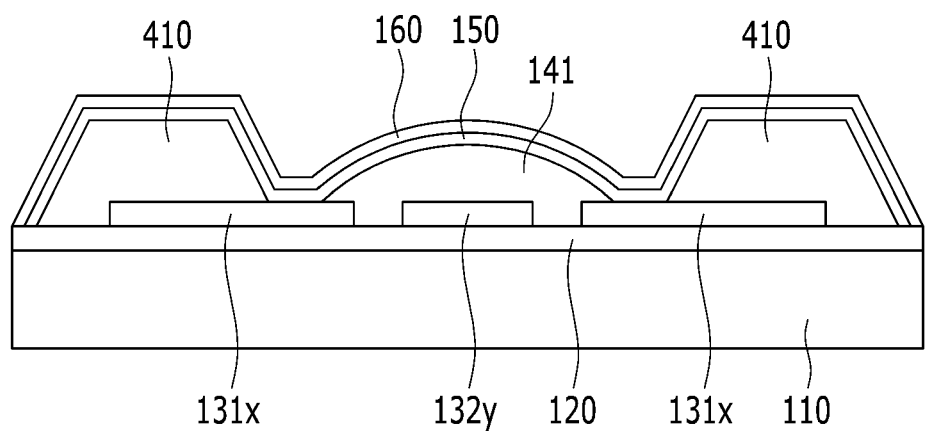
Figure 17:
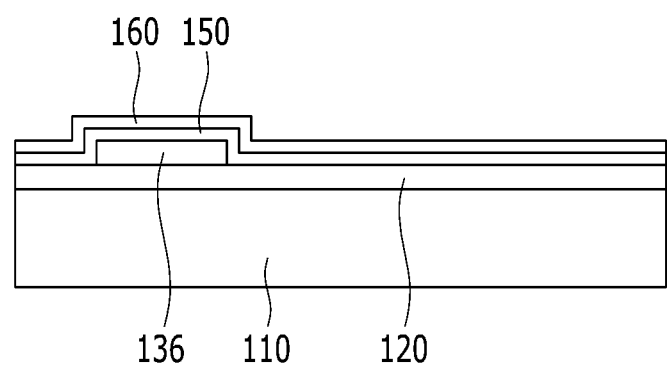
Figure 18:
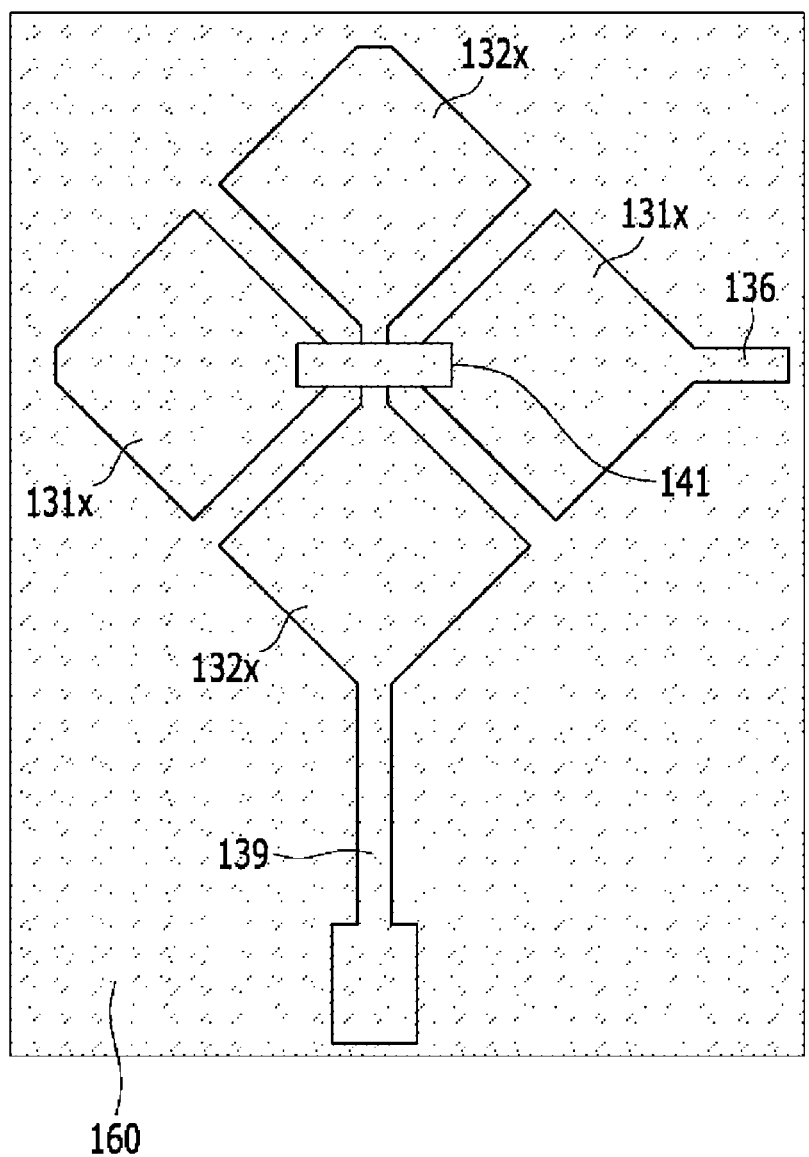

Next, after the step described above with reference to FIG. 14 and FIG. 15, a metal layer 160 having low resistance is disposed on the TCO layer 150 (see FIG. 16 to FIG. 18). The metal layer 160 may be made of any metal material having low resistance, e.g., Cu, Al, Mo, or the like.

Figure 19:
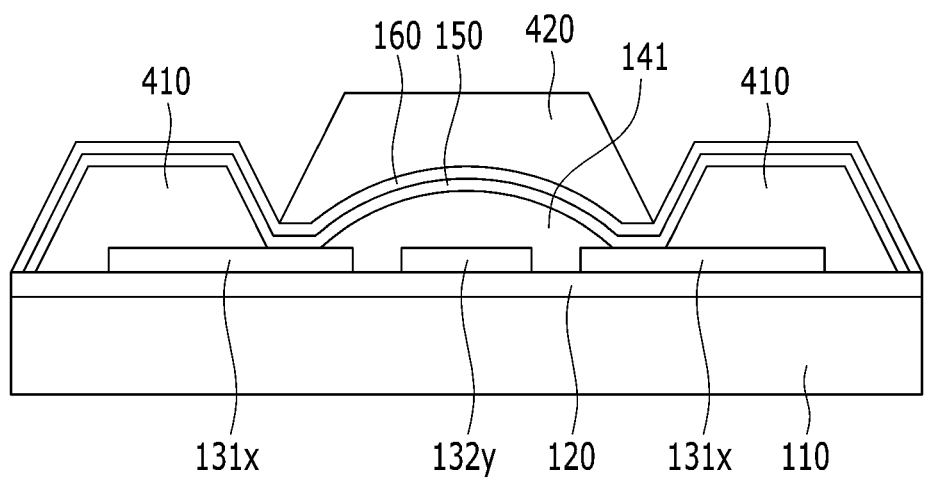
Figure 20:
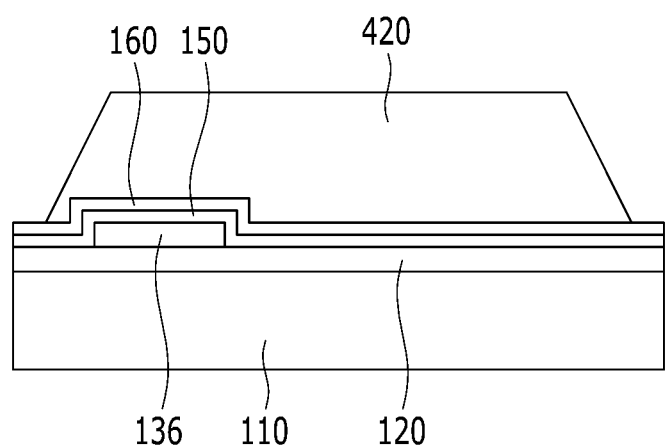
Figure 21:
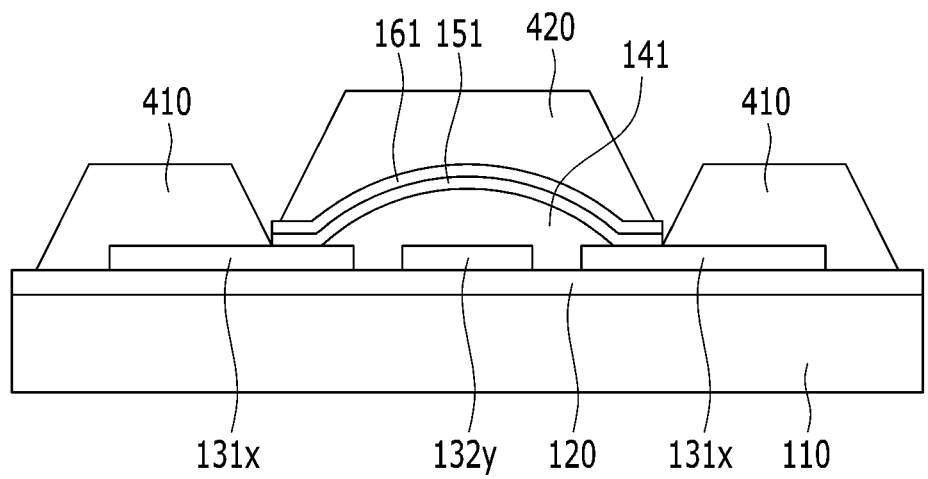
Figure 22:
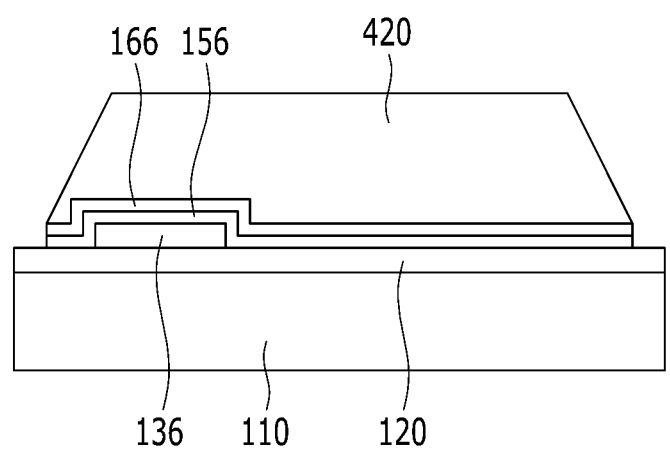
Figure 23:
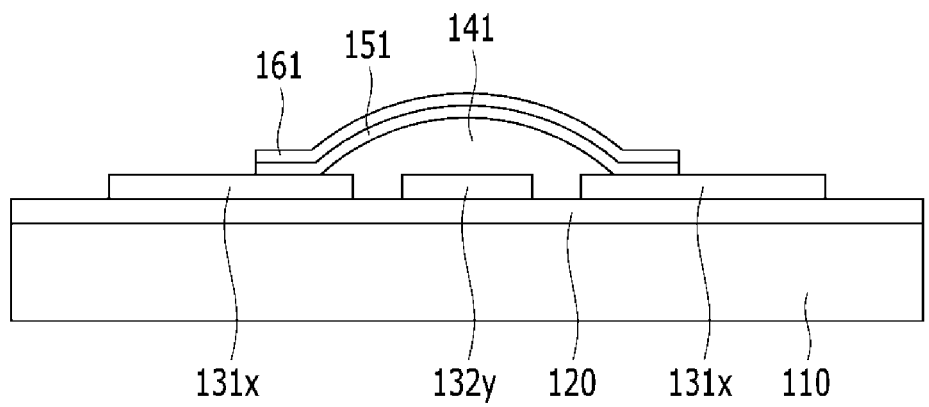
Figure 24:
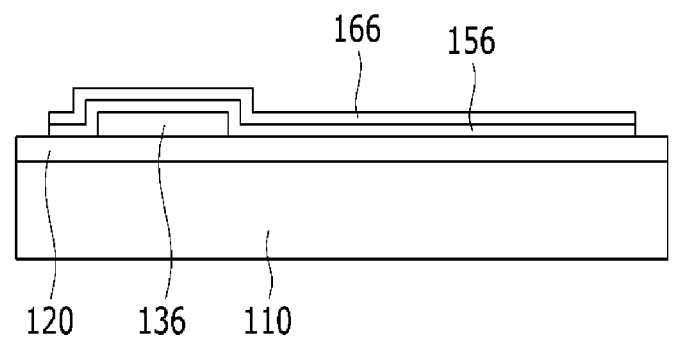
Figure 25:
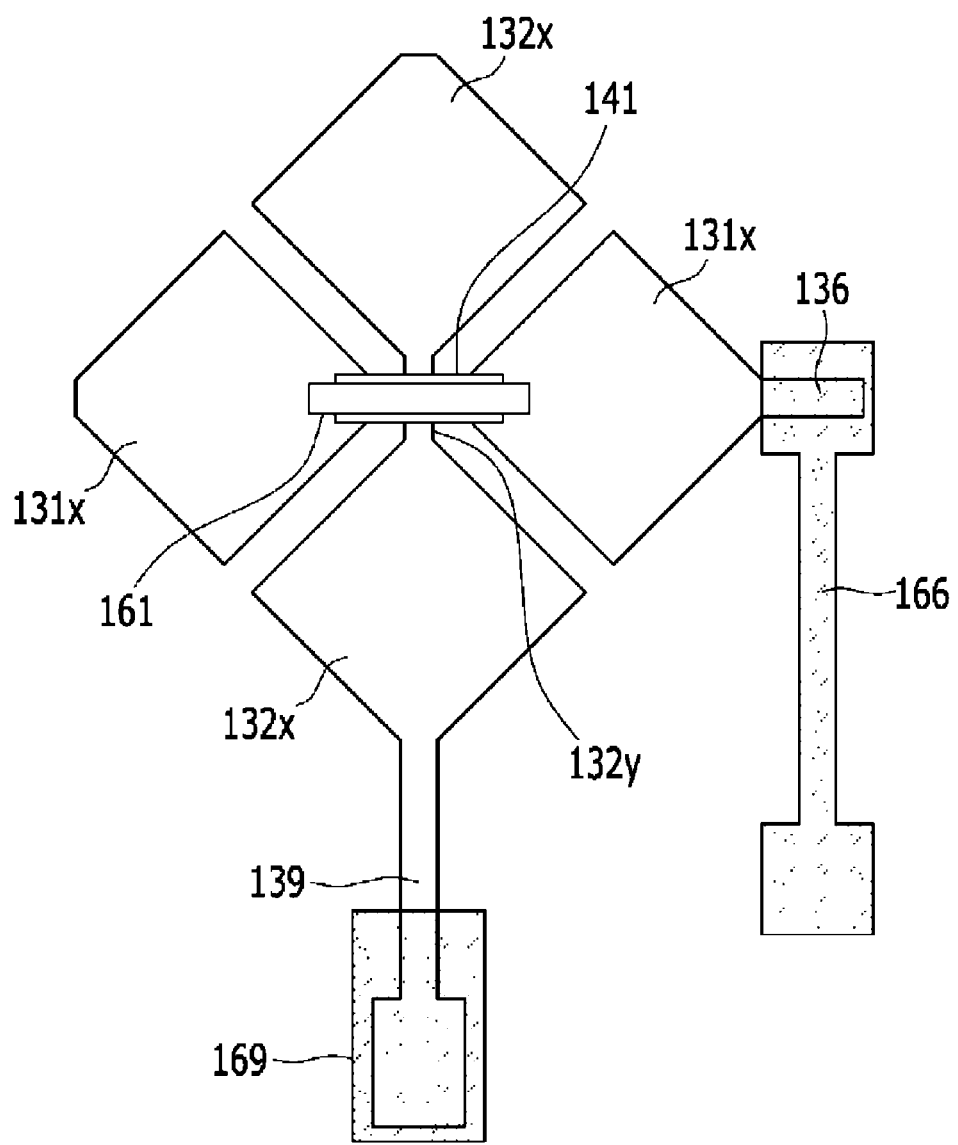

Next, a third photosensitive film pattern 420 is formed on the metal layer 160 having low resistance by using a mask as shown in FIG. 19 and FIG. 20. The low-resistance metal layer 160 and the TCO layer 150 are etched by using the formed third photosensitive film pattern 420 as shown in FIG. 21.

After the etching, the remaining third photosensitive film pattern 420 is removed. Accordingly, referring to FIG. 23 to FIG. 25, the first connecting member 151 formed of the TCO material is formed on the insulating pattern 141, and a low-resistance metal pattern 161 having the same planar shape is also formed.

Figure 26:
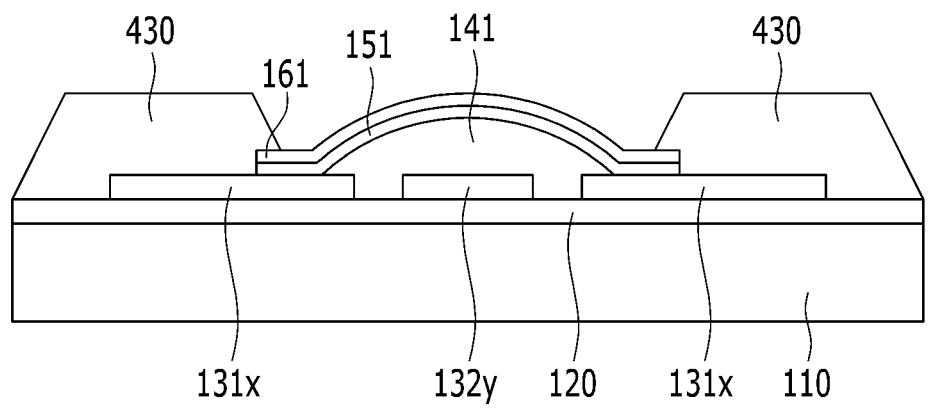
Figure 27:
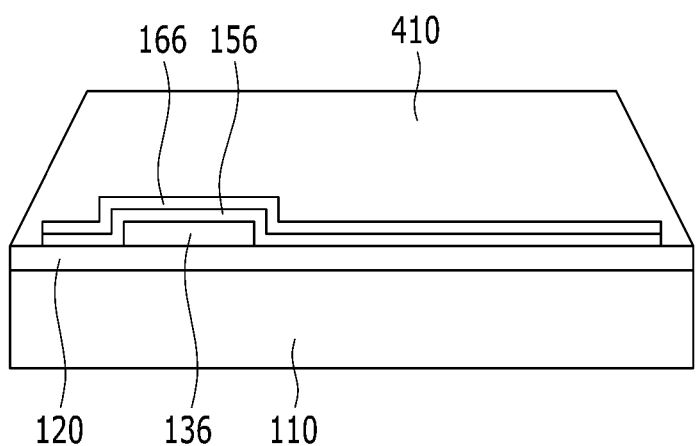

Next, referring to FIG. 26 and FIG. 27, a fourth photosensitive film pattern 430 is formed by using a mask. The fourth photosensitive film pattern 430 is formed so as to remove the low-resistance metal pattern 161 formed on the first connecting member 151. This is because, when a metal layer having low resistance is disposed on a TCO layer having high resistance in the extension members 136 and 139 of portions connected to a circuit unit or a driving unit, the low-resistance metal layer located within a touch panel region is not transparent and may be undesirably visible to a user.

Figure 28:
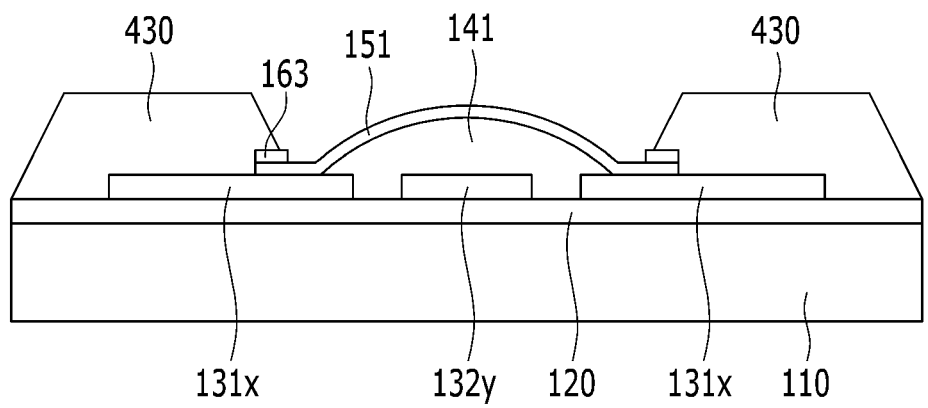
Figure 29:
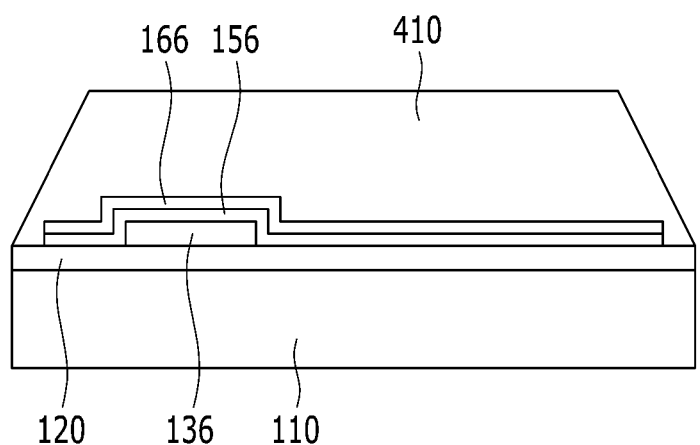

Referring to FIG. 28 and FIG. 29, the first connecting member 151 is exposed by partially removing the low-resistance metal pattern 161 located on the conductive patterns 131x and 132x. In this case, a portion of the metal pattern 161 may remain to form an auxiliary connecting member 163 which surrounds the first connecting member 151.

Figure 30:
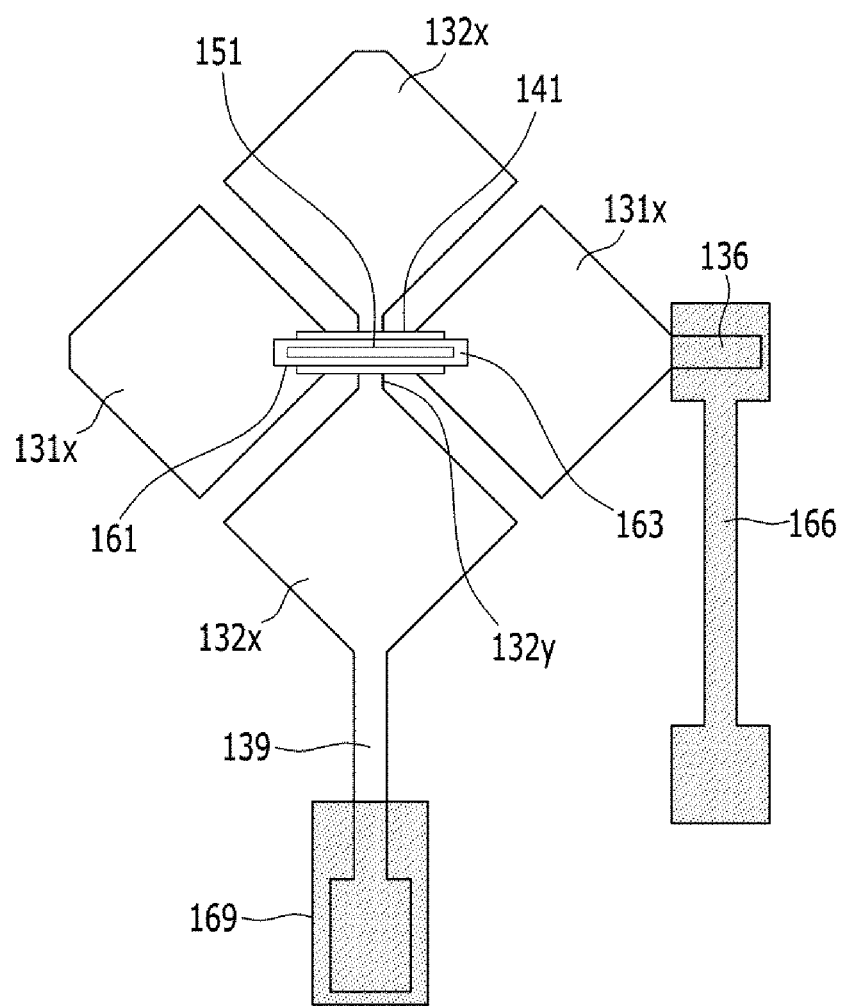

If the low-resistance metal pattern 161 is formed to cover the low resistance metal pattern 161, it becomes difficult to etch only the low-resistance metal layer 160. As a result, the first connecting member 151 may also be etched so as to be undercut, thereby generating defects. Accordingly, as shown in FIG. 30, it is possible to form the auxiliary connecting member 163, which is located on the first connecting member 151, while fully surrounding the first connecting member 151.

Further, the low-resistance metal layer located at the regions corresponding to the extension members 136 and 139 forms additional wires 166 and 169 to be connected to the circuit unit or the drive unit.

Accordingly, a transparent connecting member can be located at a touch panel region that is visible to the outside, and the extension member connected to a circuit unit or the like can include a substrate, a transparent conductive layer, and a non-transparent low-resistance metal layer to have appropriate resistance.

As described above, it is possible to provide a flexible touch panel and a flexible display device including the same by using a flexible conductive pattern portion. It is also possible to securely form a flexible conductive pattern portion having fine patterns formed according to the aforementioned processes.

It will be apparent to those skilled in the art that various modifications and variations can be made in the present invention without departing from the spirit or scope of the invention. Thus, it is intended that the present invention cover the modifications and variations of this invention, provided they come within the scope of the appended claims and their equivalents.

What is claimed is:

1. A touch panel comprising:
  a substrate;
  rows of first conductive patterns disposed on the substrate in a first direction and spaced apart by a preset distance, each first conductive pattern being separately formed;
  columns of second conductive patterns disposed on the substrate in a second direction so as to separately intersect the rows of the first conductive patterns, the columns being spaced apart by a preset distance;
  a second connecting member connecting adjacent second conductive patterns;
  an insulating pattern covering a preselected region of the second connecting member; and
  a first connecting member disposed on the insulating pattern connecting adjacent first conductive patterns; and
  an auxiliary connecting member having an edge overlapping an edge of the first connecting member,
  wherein the first conductive patterns and the second conductive patterns are flexible.

2. The touch panel of claim 1, wherein the first connecting member comprises a transparent conductive oxide (TCO).

3. A touch panel comprising:
  a substrate;
  rows of first conductive patterns disposed on the substrate in a first direction and spaced apart by a preset distance, each first conductive pattern being separately formed;
  columns of second conductive patterns disposed on the substrate in a second direction so as to separately intersect the rows of the first conductive patterns, the columns being spaced apart by a preset distance;
  a second connecting member connecting adjacent second conductive patterns;
  an insulating pattern covering a preselected region of the second connecting member;
  a first connecting member disposed on the insulating pattern connecting adjacent first conductive patterns; and
  an auxiliary connecting member having an edge overlapping an edge of the first connecting member,
  wherein:
  the first conductive patterns and the second conductive patterns are flexible;
  the first conductive patterns, the second conductive patterns, and the second connecting member comprise silver nanowires (AgNW);
  wherein the substrate comprises a polymer resin layer; and
  the first conductive patterns are electrically connected to each other by the first connecting member and the second conductive patterns are connected to each other by the second connecting member.

4. The touch panel of claim 3, wherein the first connecting member comprises a transparent conductive oxide (TCO).

* * * * *